United States Patent [19]

Tanaka et al.

[11] Patent Number: 5,408,116
[45] Date of Patent: Apr. 18, 1995

[54] GROOVED GATE TRANSISTOR HAVING SOURCE AND DRAIN DIFFUSED LAYERS WITH SPECIFIED GROOVE CORNER SHAPE

[75] Inventors: Junko Tanaka, Kawaguchi; Toru Toyabe, Kokubunji; Shin'ichiro Kimura, Kunitachi; Hiromasa Noda, Tokyo; Sigeo Ihara, Tokorozawa; Kiyoo Itoh, Higashikurume; Yasushi Gotoh, Kokubunji, all of Japan

[73] Assignee: Hitachi, Ltd., Tokyo, Japan

[21] Appl. No.: 105,330

[22] Filed: Aug. 9, 1993

[30] Foreign Application Priority Data

Aug. 24, 1992 [JP] Japan .................................. 4-223842

[51] Int. Cl.6 ...................... H01L 29/78; H01L 29/06
[52] U.S. Cl. ..................................... 257/327; 257/306; 257/401; 257/622
[58] Field of Search ......... 257/327, 622, 401, 306–309

[56] References Cited

U.S. PATENT DOCUMENTS

| | | | |
|---|---|---|---|
| 4,324,038 | 4/1982 | Chang et al. | 257/327 |
| 4,685,196 | 8/1987 | Lee | 257/327 |
| 4,830,975 | 5/1989 | Bovaird et al. | 257/622 |

FOREIGN PATENT DOCUMENTS

| | | |
|---|---|---|
| 50-8483 | 1/1975 | Japan . |
| 0294478 | 9/1988 | Japan . |
| 02101774 | 10/1988 | Japan . |
| 03283670 | 3/1990 | Japan . |

OTHER PUBLICATIONS

"A Straight–Line–Trench Isolation and Trench–Gate Transistor (SLIT) Cell for Giga-bit DRAMs"; VLSI Symposium; Jun., 1993, pp. 19–20, M. Sakao et al.
"Trench Transistor Cell with Self-Aligned Contact (TSAC) for Megabit MOS DRAM", IEEE Int. Electron Devices Meeting, ©1986.
Brews, J. R., et al., "Generalized Guide for MOSFET Miniaturization," IEEE Electron Device Letters, vol. EDL-1. No. 1, Jan. 1980, pp. 2–4. (English).
Nishimatsu, Shigeru, et al., "Grooved Gate MOSFET", Japanese Journal of Applied Physics, vol. 16, 1977, pp. 179–183. (English).
Hieda, Katsuhiko, et al., "Sub–Half–Micrometer Concave MOSFET with Double LDD Structure", IEEE Transactions on Electron Devices, vol. 39, No. 3, Mar. 1992, pp. 671–676. (English).

Primary Examiner—Gene M. Munson
Attorney, Agent, or Firm—Fay, Sharpe, Beall, Fagan, Minnich & McKee

[57] ABSTRACT

A finely structured grooved gate transistor of which the threshold voltage does not decrease in spite of the small size and of which the threshold voltage of the transistor can be adjusted by shape. The shape of a groove corner of the transistor as a semiconductor device is contained in a concentric circle having a radius of curvature $r \pm L/5$ (L: channel length) and the radius of curvature r, i.e., the geometric parameter has a relationship with the doping concentration as shown in FIG. 1B. Alternatively, the average $(a+b)/2$ (geometric parameter) of the sum of the two sides opposite the right angle of a right triangle formed of a straight line in contact with the gate bottom in parallel to the substrate surface of a grooved gate transistor, a perpendicular line to the substrate bottom surface from the source and drain ends at a portion formed with a channel and a straight line in contact with the groove corner has a relationship with the doping concentration as shown in FIG. 1B. The threshold voltage is not reduced even when the channel length is decreased by adjusting the groove shape and the doping concentration.

4 Claims, 8 Drawing Sheets

GROOVED GATE TRANSISTOR HAVING SOURCE AND DRAIN DIFFUSED LAYERS WITH SPECIFIED GROOVE CORNER SHAPE

BACKGROUND OF THE INVENTION

The present invention relates to a semiconductor device, or more in particular to a fine-structured MOS transistor.

In order to achieve a high speed and a high integration of a device, the MOS transistor has progressed toward an ever smaller size according to the scaling rule. The scaling rule advocated by J. R. Brews, for example, permits a device to be reduced in size by decreasing the junction depth of the diffused layer and/or the thickness of the gate oxide and/or increasing the substrate doping concentration. This scaling rule is discussed in IEEE, Electron Device Letters, EDL-1, No. 1 (1980) pp. 2-4 and still provides one indicator for size reduction.

As the channel length reaches the order of 0.1 $\mu$m with the miniaturization of the device, however, the parameter for miniaturization under the scaling rule reaches a physical limit. When the junction depth of the diffused layer is reduced, the contact resistance is increased. A thinner oxide film, on the other hand, causes a tunneling current. Also, an increased substrate concentration leads to variations in threshold voltage or a deteriorated cut-off characteristic. In this way, the size reduction of the conventional structure by scaling has reached its own limit.

Figure 10:
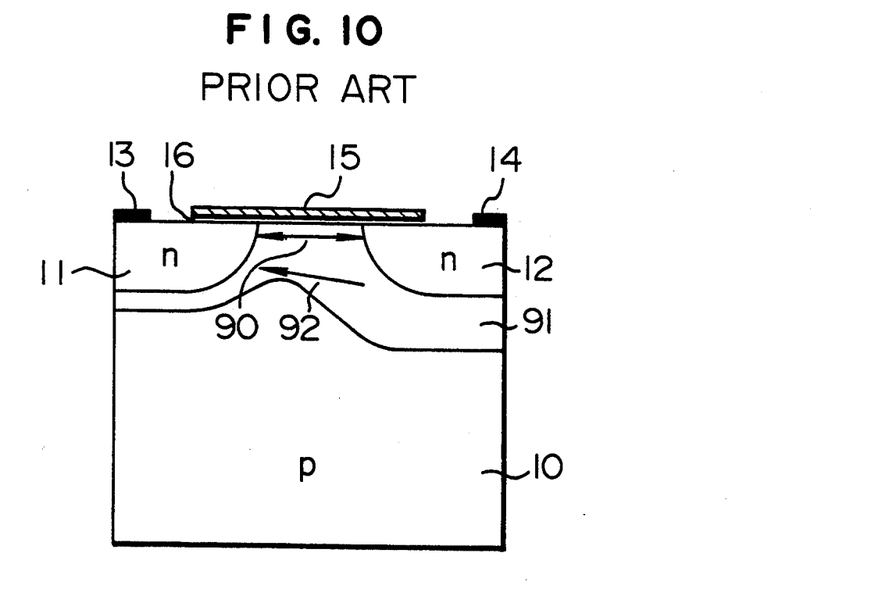
FIG. 10 shows a sectional structure of a conventional MOS transistor having a planar structure.
Figure 11:
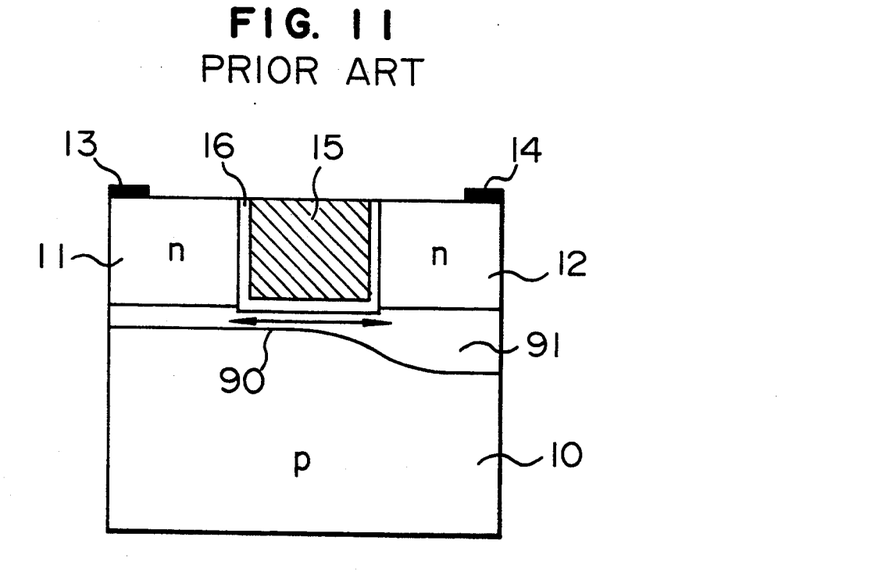
FIG. 11 shows a sectional structure of a conventional MOS transistor having a grooved gate structure.

As a method for breaking this limit of size reduction of the MOS transistor, a conventional device as described in JP-A-50-8483 is known in which that side of the gate electrode which is in contact with an insulator is embedded deeper in a semiconductor substrate than the lower side of the drain. The structure of such a device is shown in FIG. 11. When a gate electrode 15 is grooved as shown in FIG. 11 (a grooved-gate structure), the extension of a depletion layer of the drain 91 fails to reach a source 11 under the influence of the drain voltage, and therefore a punchthrough indicated by 92 which otherwise might be caused by the current flowing through the region in the depletion layer 91 not in the control of the gate electrode 15 can be suppressed, thereby realizing a device smaller in channel length 90 than a conventional transistor having a planar structure as shown in FIG. 10.

A technique for further reducing the size of a device is described in JP-A-2-94478. According to this known method, a grooved gate transistor is formed with N+ and N— diffused layers, a high melting point metal film and an insulator to suppress the punchthrough and to reduce the parasitic capacitance and the series resistance. Also, JP-A-2-101774 and JP-A-3-283670 disclose an LDD (Lightly Doped Drain-Source) structure known as a diffused layer structure for a transistor having a conventional planar structure combined with a grooved gate transistor to alleviate the electric field at the drain.

Figure 6:
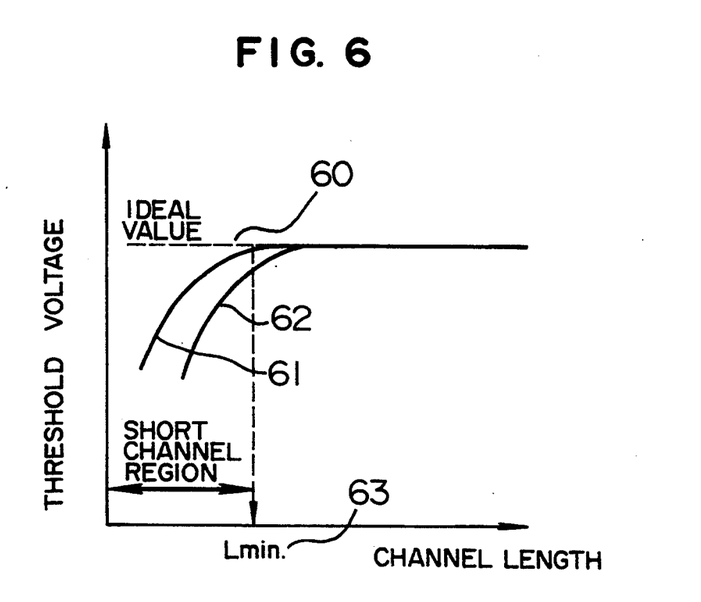
FIG. 6 is a characteristic diagram showing dependency of the threshold voltage on the effective channel length.

In the above-mentioned conventional grooved gate MOS transistor, although the structure can be reduced in size by suppressing the punchthrough more than the planar structure, the threshold voltage is undesirably decreased in a smaller region. FIG. 6 shows threshold voltage to channel length characteristic curves. The threshold voltage of a grooved gate MOS transistor 61, which lowers less than that of a conventional planar structure 62, decreases with a further decrease in channel length. In the short channel region resulting in lowering the threshold voltage, a punch-through current 92 flows deep in the substrate as shown in FIG. 10, and therefore the current cannot be controlled by the gate voltage so that the threshold voltage greatly vanes, thus making it impossible to obtain a normal transistor characteristic. An ideal threshold voltage characteristic, as indicated by a curve 60, is constant regardless of the channel length.

The various effects of a given shape on the threshold voltage characteristic or the various characteristics caused by a given shape have not been made clear in the prior art. The substrate concentration or doping concentration dependency is not known either.

SUMMARY OF THE INVENTION

An object of the present invention is to provide a very small semiconductor device in which the threshold voltage is not decreased with the miniaturization of the structure and an ideal threshold voltage is obtained.

Another object of the present invention is to provide a semiconductor device in which the threshold voltage of a transistor can be regulated (or controlled) by the use of the change in shape.

Still another object of the invention is to provide a quantum wire transistor utilizing the geometric effect of a groove.

Figure 1A:
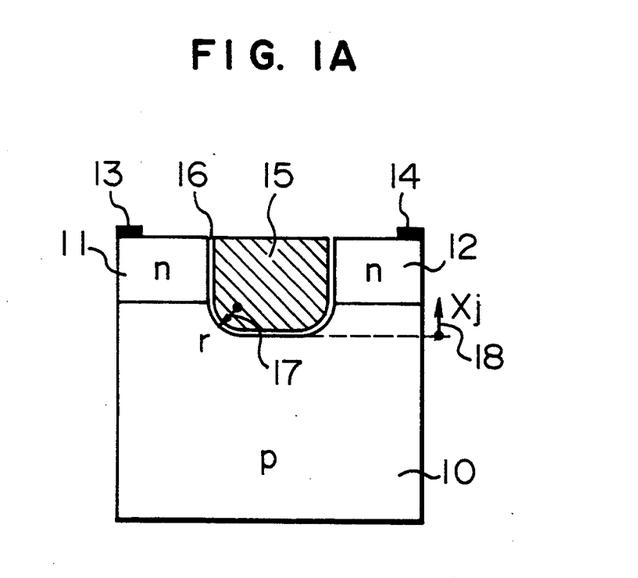
FIG. 1A is a sectional view of a semiconductor device showing an embodiment of the invention.
Figure 1B:
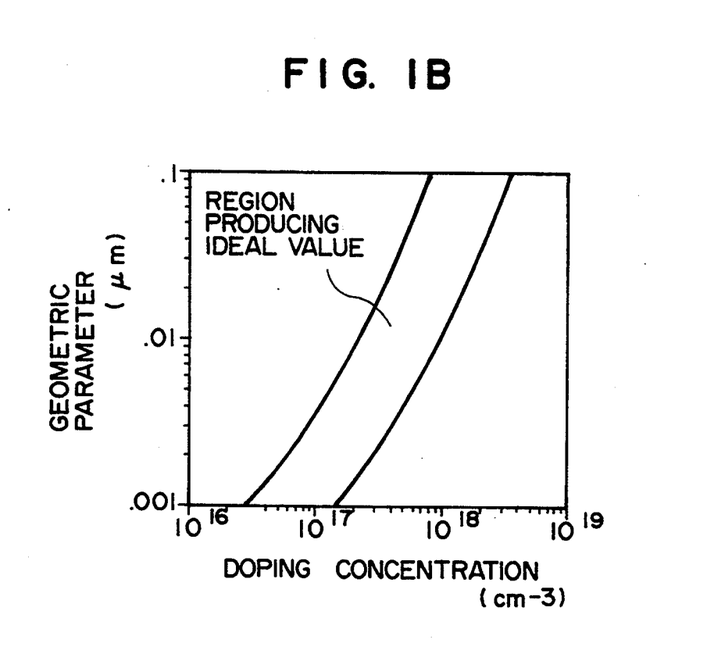
FIG. 1B is a graph showing a specific relation between a geometric parameter and a doping concentration according to the invention.

In order to achieve the above-mentioned first and second objects, according to an aspect of the present invention, there is provided a semiconductor device in which the shape of a concave corner of a transistor having a grooved gate structure is contained in a concentric circle with a radius of curvature $r\pm L/5$ (L:channel length) and the radius of curvature r (geometric parameter) has a relationship with the doping concentration as shown in FIG. 1B.

As an alternative, in a grooved gate transistor, the average of the sum $(a+b)/2$ (geometric parameter) of the two sides opposite to the right angle corner of a right triangle formed by a straight line in contact with the gate bottom parallel to the surface of a semiconductor substrate, a perpendicular line to the substrate bottom from the ends of the source and drain at a portion formed with a channel and a straight line in contact with a concave corner has a relation with the doping concentration as shown in FIG. 1B.

In order to achieve the above-mentioned third object, according to an aspect of the present invention, there is provided a semiconductor device in which a grooved gate is formed in the substrate, and electrons are enclosed in the groove bottom, whereby the electrons in the substrate are set in motion in the one-dimensional direction.

According to the aspects of the invention, the shape and the doping concentration are regulated to produce an ideal threshold voltage characteristic preventing the threshold voltage from decreasing with the reduction in structure size. As a result, the short channel effect is suppressed and the punchthrough breakdown voltage increases, thereby making possible transistor size reduction and high integration.

Also, since the threshold voltage can be controlled according to shape, the performance deterioration due to the increase in substrate concentration can be prevented more than in the prior art.

Further, in the case where the electron flow is enclosed in a one-dimensional region by the use of the groove shape, the electrons move substantially without being affected by the scattering thereof, thereby increasing the operating speed of the transistor.

DESCRIPTION OF THE PREFERRED EMBODIMENTS

An embodiment of the invention will be described with reference to the accompanying drawings. FIG. 1A shows a semiconductor device according to an embodiment of the invention, and FIG. 1B a graph showing a specific relation between the shape of the same semiconductor device and the doping concentration. As shown in FIG. 1A, the semiconductor according to this embodiment has a grooved gate structure with n type-diffused layers 11, 12 positioned on two sides of a gate electrode 15 on a p type-silicon substrate 10. The boundary of the gate electrode 15 or the oxide 16 is curved and has a radius of curvature r 17 at a grooved concave corner thereof. The n type-diffused layers 11, 12 are provided with a source electrode 13 and a drain electrode 14 on the top thereof.

The junction depth of the diffused layers 11, 12 is Xj 18, and it is assumed that Xj<0 when the junction depth is above the groove bottom. The feature of the present embodiment resides in that the groove is shaped so as to be contained in an arcuate band having a width of 2L/5 (L: channel length) around an arc having a radius of curvature of r 17 and that the radius of curvature r 17 (geometric parameter) has a relationship with the doping concentration (of the substrate surface) as shown in FIG. 1B. As a result, a very small device is realized in which the threshold voltage does not decrease even when the channel length is shortened.

An example of the method for fabricating a semiconductor device according to the invention is now described. In FIG. 1A, a p type-silicon substrate is patterned with resist, and etched for silicon to form a groove of a desired shape, and then the resist is removed. A gate oxide film 16 is grown on the surface of the groove, on which is deposited a polysilicon as a conductive layer containing impurities, for example, providing the gate electrode 15. The gate polysilicon is etched off from the substrate surface, followed by etching off the gate oxide film 16. Then, impurities are injected by ion implantation to form the diffused layers 11, 12 of a semiconductor. A subsequent annealing process as required causes the impurities to penetrate deep into the silicon substrate 10 thereby to enlarge the junction depth Xj 17. These steps complete a semiconductor device according to the aspect of the invention.

As an alternative method, after an isolation oxide, the source electrode 13 and the drain electrode 14 are formed of a polysilicon film, followed by patterning after the forming of an oxide. After then, an impurity layer providing the diffused layers 11, 12 of the semiconductor device is formed by ion implantation. As the next step, an anisotropic etching is effected to form a sidewall oxide on the source region 11 and the drain region 12. The silicon anisotropic etching is performed with the oxide film as a mask, and the impurity region of the channel is etched. A gate oxide 16 is formed by thermal oxidation. Boron (B), as an example, is injected through the gate oxide 16 to form a p type-impurity region as channel doping. A polysilicon film is deposited, and the gate electrode 15 is formed by patterning. These steps can also fabricate a semiconductor according to the invention.

Figure 7A:
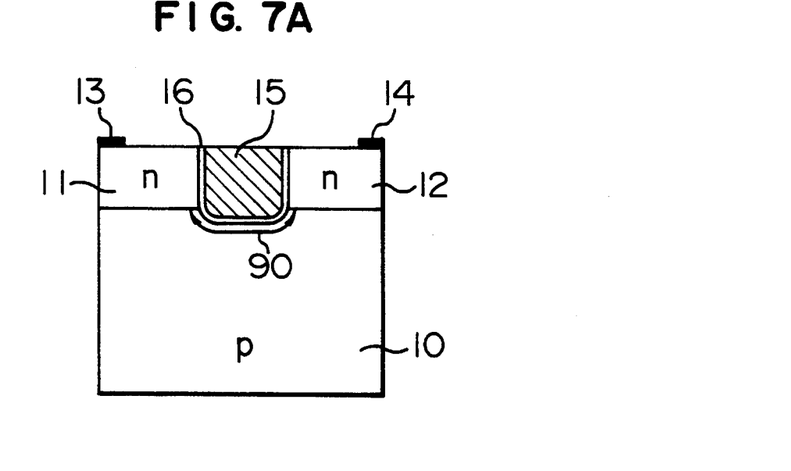
FIGS. 7A, 7B and 7C are sectional diagrams for explaining the characteristics of the effective channel length with respect to the threshold voltage including the prior art device structure, respectively.
Figure 7B:
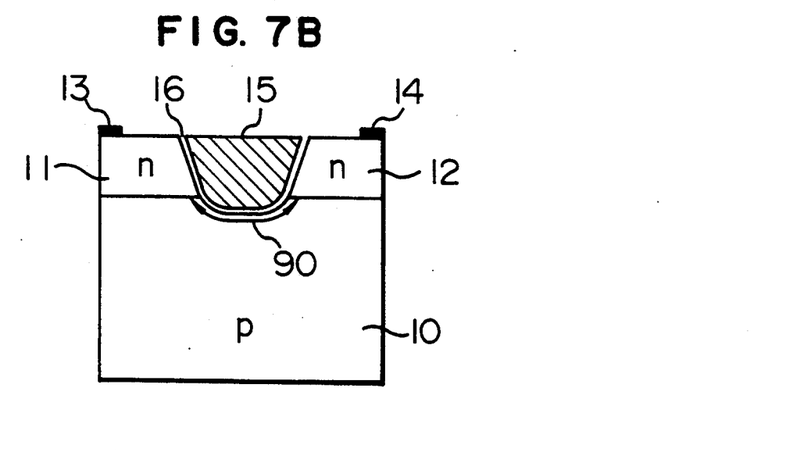
Figure 7C:
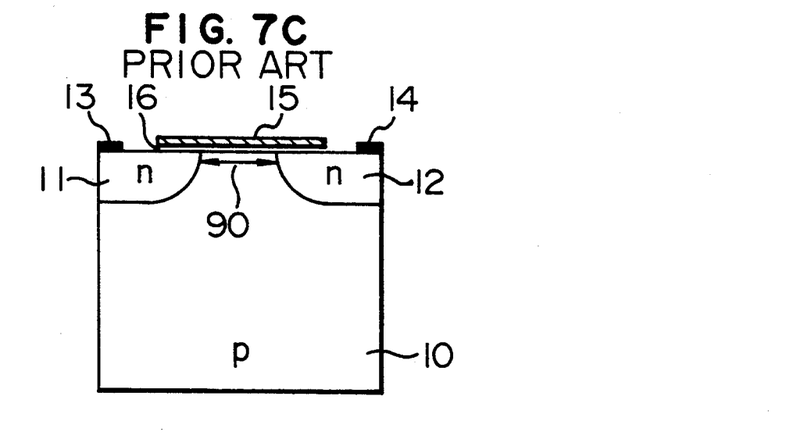
Figure 8:
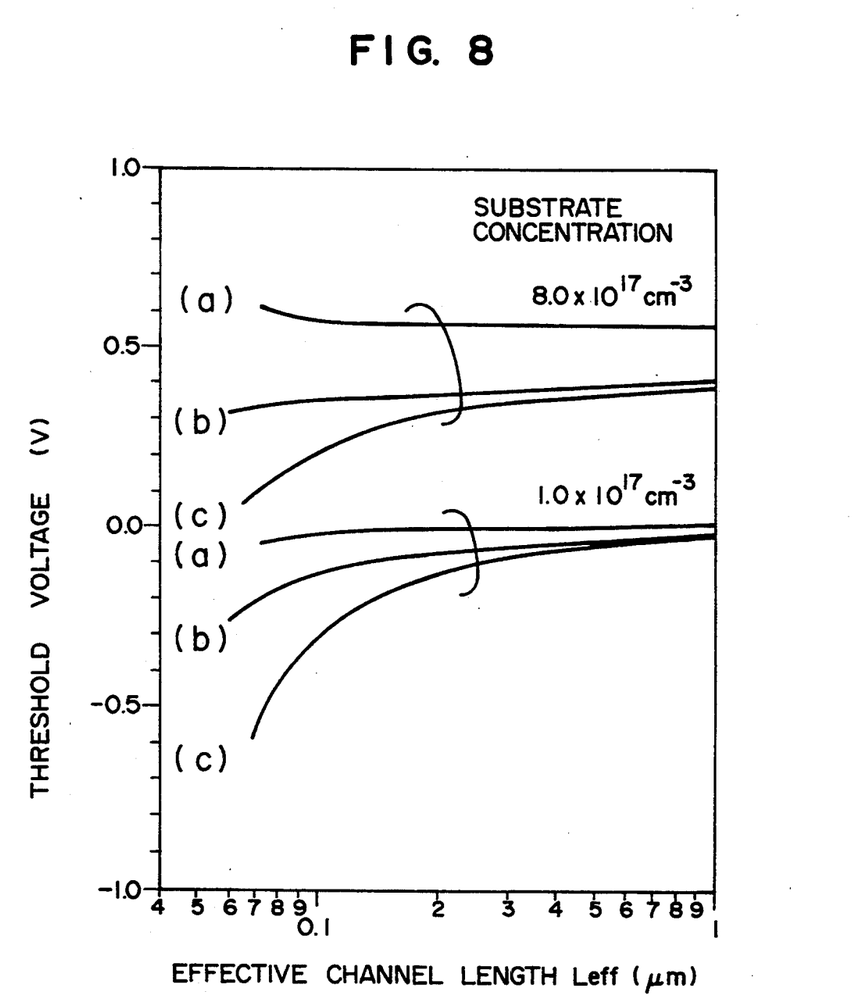
FIG. 8 is a characteristic diagram showing dependency of the threshold voltage on the effective channel length for explaining the invention.

For detailed explanation of the present embodiment, various gate structures are shown in FIGS. 7A to 7C, and the result of simulating the dependency of the threshold voltage on the effective channel length with the structure (shape) and substrate concentration changed in FIG. 8. As already well known, the grooved gate structures shown in FIGS. 7A and 7B are more effective in suppressing the punchthrough and therefore causes a lesser drop in threshold voltage than the conventional planar structure shown in FIG. 7C. Further, a simulation shows that different groove shapes result in varying threshold voltage values for the same substrate concentration and the same doping concentration distribution of the diffused layer and that the smaller the radius of curvature r 17 of the concave corner (i.e., the nearer to the right angle), the higher the threshold voltage.

Further, it should be noted that when the substrate concentration of a grooved gate transistor having the structure shown in FIG. 7A is $1 \times 10^{17}/cm^3$, the threshold voltage somewhat decreases with the decrease in channel length, while at a substrate concentration of $8 \times 10^{17}/cm^3$, the threshold voltage increases with the decrease in channel length. This fact shows that as far as the shape of a groove is determined, the threshold voltage assumes an ideal value remaining unchanged with the decrease in channel length by changing the substrate concentration. It has also been found that unlike the prior art in which a desired threshold voltage is obtained by controlling the doping concentration, the threshold voltage can be controlled also by changing the groove shape. The larger the radius of curvature r 17, the electric field at the drain region is alleviated more, thereby reducing the generation of hot electrons having high energy.

In view of this, a semiconductor device operable without changing the threshold voltage can be obtained with a fine structure, in the case where the radius of curvature r 17 and the doping concentration of the substrate surface are selected appropriately as parameters and the relation therebetween is as shown in FIG. 1B. If the channel length is reduced when the junction depth Xj 18 is larger than zero, the depletion layers at the source junction and the drain junction come into contact with each other causing a punchthrough, always resulting in a reduced threshold voltage. As far as the design requirement is met that the channel length be longer than the minimum channel length Lmin.63 on which the threshold voltage is dependent as shown in FIG. 6, a device is realized which is operable without changing the threshold voltage even when the junction depth $Xj > 0$ or the structure is reduced in size.

In the case where the substrate concentration at a portion deeper than the gate bottom is high, the punchthrough can be suppressed more.

With the increase in the absolute value of Xj smaller than zero, the drop in the threshold voltage due to the decreasing channel length can be further prevented.

Figure 2:
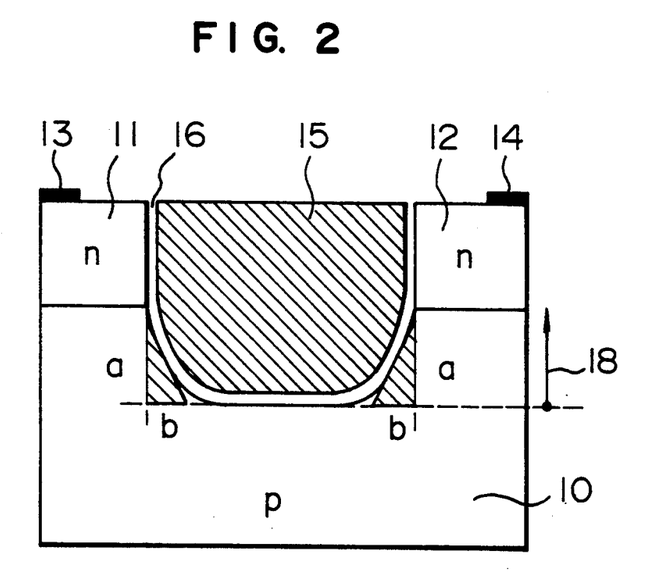
FIG. 2 is a sectional view of a semiconductor device showing another embodiment of the invention.

Although the shape of the grooved gate is defined by the radius of curvature r 17 in the aforementioned embodiment, it may alternatively be defined by the method described below. Another embodiment of the invention is shown in FIG. 2. According to this embodiment, a right triangle formed by a straight line in contact with the gate bottom in parallel to the surface of the semiconductor substrate, a perpendicular line to the substrate bottom from the source and drain ends at a portion formed with a channel and a straight line in contact with the concave corner of the groove, is used as a parameter representing the shape. The feature of this embodiment resides in that the average (a+b)/2 (geometric parameter) of the sum of the two sides forming the right angle of the right triangle and the doping concentration have a relationship as shown in FIG. 1B. Several right angles are conceivable in which the hypotenuse is in contact with the groove concave corner. According to the embodiment under consideration, in order to eliminate the ends of the corner, a and b are employed associated with the maximum area of the right triangle. The use of this method realizes a small device without any drop in the threshold voltage even for a shorter channel length as in the preceding embodiment.

Although the foregoing description of embodiments concerns an n-channel type of semiconductor, the same can be said of a p-channel type with equal effect.

Figure 5:
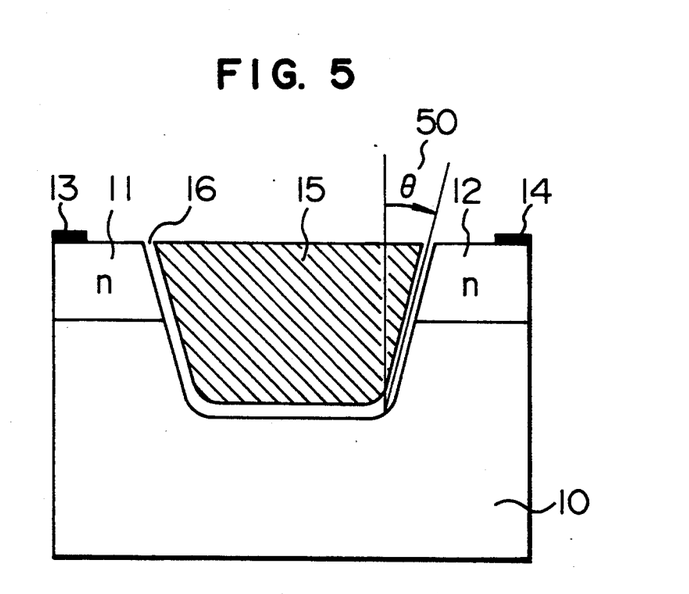
FIG. 5 is a sectional view of a semiconductor device showing still another embodiment of the invention.

Also, by changing the angle $\theta$ 50 of the portion formed with a current-carrying channel to the perpendicular direction as shown in FIG. 5, the ease with which current flows changes accordingly. With the decrease in the angle $\theta$ 50, less current flows thereby to suppress the short channel effect.

Now, explanation will be made of a method for controlling the shape of the groove of a semiconductor device according to the embodiment shown in FIGS. 1 and 2. The radius of curvature r 17 is controllable by controlling the flow rate of the etching gas in the microwave plasma etching process. Assume that the gas flow rate is changed between 5 and 50 cc at a pressure of 10 mtorr and a temperature of $-130°$ C. A groove with a radius of curvature r of 0.005 $\mu$m is formed when the $SF_6$ flow rate is 5 cc, while if $SF_6$ flow rate is 25 cc, by contrast, the radius of curvature of the groove obtained is 0.02 $\mu$m. More specifically, the higher the flow rate of the $SF_6$ gas, the larger the radius of curvature obtained. Etching with $Cl_2$ gas at normal temperature produces a groove which is substantially zero in the radius of curvature r.

A method for controlling the angle $\theta$ 50 in FIG. 5 will be explained. The angle $\theta$ 50 is controlled by adjusting the concentration ratio between $O_2$ and $Cl_2$ of the $Cl_2$ gas with the $O_2$ added thereto as an etching gas in the microwave plasma etching process. When the pressure is 10 mtorr, the temperature is normal and the concentration ratio of $Cl_2$ and $O_2$ is 17:3, for example, the angle $\theta$ is 7°, while if $Cl_2:O_2=20:0$, the angle $\theta$ is 0°. In other words, the higher the $O_2$ proportion, the larger the angle $\theta$.

Figure 3:
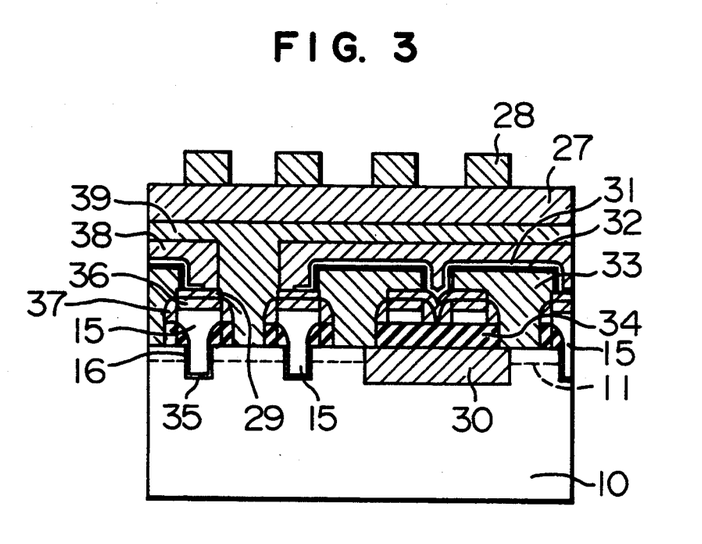
FIG. 3 is a sectional view showing a semiconductor device according to the invention used as a DRAM cell.

The grooved gate transistor according to the invention can be assembled in a memory such as DRAM or SRAM. An application of the grooved gate transistor according to the invention to a stacked capacitor cell will be explained. As shown in FIG. 3, for example, a groove 35 is formed in a substrate 10 with an insulator 34 and a sidewall insulator 37 as a mask thereby to form a grooved gate transistor. Storage capacitors 31, 32 and 33 extend over a word line 15, so that the storage capacitance can be increased as compared with a simple planar structure. Numeral 30 designates an isolation oxide, numeral 16 a gate oxide, numeral 36 an oxide, numeral 11 a diffused layer, numeral 38 an oxide for intermediate dielectric, numeral 39 a data line, numeral 27 an intermediate dielectric, and numeral 29 an oxide. A metal interconnection 28 is used for reducing the resistance of the gate electrode 15 and is connected to the gate electrode at a point not shown. Applying a grooved gate transistor to a memory cell as in the embodiment under consideration realizes size reduction while securing high reliability at the same time.

Figure 4A:
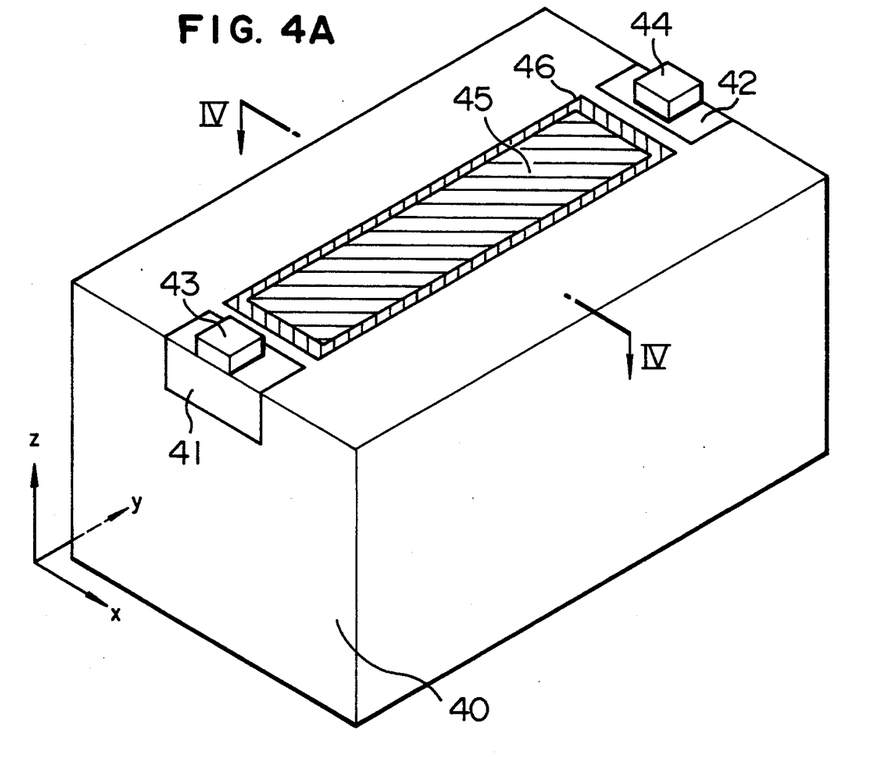
FIG. 4A is a perspective view showing a semiconduct device according to another embodiment of the invention.
Figure 4B:
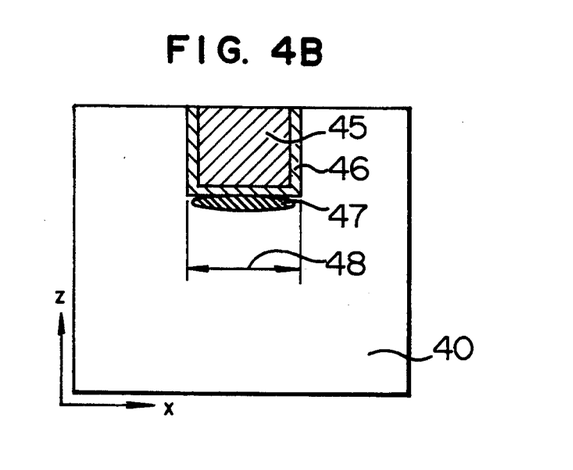
FIG. 4B is a sectional view taken along line A—A in FIG. 4A.

Now, another embodiment will be explained with reference to FIGS. 4A and 4B. FIG. 4A shows in perspective view a semiconductor device according to an embodiment of the invention, and FIG. 4B is a sectional view taken along line A—A in FIG. 4A. A gate electrode 45 is formed on a gate oxide 46 in a groove of a silicon substrate 40. A channel 47 for passing electrons is formed in the bottom surface of the gate electrode 45. Electrons flow along y axis between a source 41 and a drain 42. Numeral 43 designates a source electrode, and numeral 44 a drain electrode. The channel width W 48 has a size as large as a quantum wire, and electrons move only in one direction without being affected substantially by the scattering as in a conventional quantum wire transistor.

The embodiment under consideration has the feature that the geometric effect of the groove encloses electrons in the bottom surface of the gate electrode 45 to form a quantum wire transistor, thereby improving the operating speed of the MOS transistor. Further, as compared with the conventional quantum wire transistor, the embodiment is easy to fabricate and permits high integration.

Figure 9:
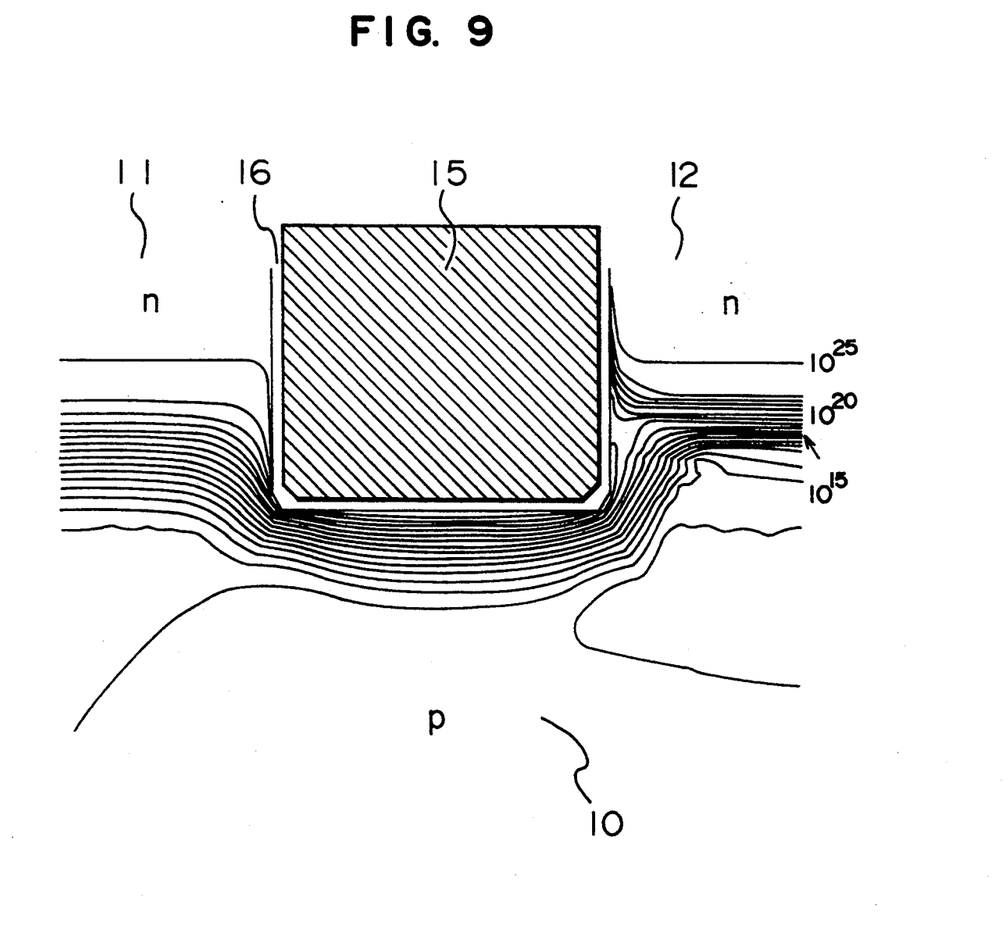
FIG. 9 is a diagram for explaining the electron concentration distribution in a section of a grooved gate MOS transistor according to the invention.

For explaining the embodiment, FIG. 9 shows an electron density distribution in a grooved gate structure. The effective channel length is 0.16 $\mu$m, the substrate concentration is $8 \times 10^{17}/cm^3$, and the drain voltage is 1.5 V, with a current of 10 nA flowing. It should be noted that the electron density is higher at the central portion of the groove bottom than at the concave corner of the groove. In other words, the grooved gate structure is capable of storing electrons in the gate bottom surface. This phenomenon is more conspicuous when the radius of curvature r of the groove is smaller and/or the substrate concentration is higher. Further, if W 48 is a size on the order of a quantum wire, electrons can be enclosed one-dimensionally along y axis, then a transistor in which electrons are movable in the one-dimensional direction are realized. The abovementioned geometric effect makes it possible to fabricate a semiconductor device according to the present embodiment for an improved operating speed of the transistor. It will thus be understood from the foregoing description that according to the present invention an ideal characteristic in which the threshold voltage does not drop even when the channel length is shortened is produced by adjusting the shape of the groove and the doping concentration, and therefore a transistor can be reduced in size for higher integration.

Furthermore, in the case where electrons are enclosed in the gate bottom surface and set in one-dimensional motion, the transistor is improved in speed, and device fabrication is facilitated while at the same time realizing a highly-packing quantum wire transistor.

We claim:

1. A grooved gate transistor having source and drain diffused layers with a grooved gate electrode therebetween in a semiconductor substrate, wherein the shape of a groove corner in said gate electrode is contained between two concentric circles having radii of curvature $r+L/5$ and $r-L/5$, respectively where L ($\mu$m) indicates a channel length, and r ($\mu$m) indicates is a radius of curvature of the corner shape, and the radius of curvature r ($\mu$m) has a relationship with a doping concentration N (cm$^{-3}$) in the surface of said semiconductor substrate as expressed by $(\frac{2}{3}) \cdot (\log_{10} r + 28) - \frac{1}{2} < \log_{10} N < (\frac{2}{3}) \cdot (\log_{10} r + 28) + \frac{1}{2}$.

2. In a grooved gate transistor having source and drain diffused layers with a grooved gate electrode therebetween in a semiconductor substrate, a semiconductor device wherein a geometric parameter represented by an average A $(=(a+b)/2)$ ($\mu$m) of a sum of two sides a and b forming the right angle of a right triangle formed of a straight line in contact with the bottom of the gate in parallel to the surface of the semiconductor substrate, a perpendicular line to the substrate bottom surface from the source and drain ends at a portion formed with a channel and a straight line in contact with a grooved corner of the gate electrode has a relationship with a doping concentration N (cm$^{-3}$) in said semiconductor substrate as expressed by $(\frac{2}{3}) \cdot (\log_{10} A + 28) - \frac{1}{2} < \log_{10} N < (\frac{2}{3}) \cdot (\log_{10} A + 28) + \frac{1}{2}$.

3. A memory cell comprising a combination of a storage capacitor and a grooved gate transistor having source and drain diffused layers with a grooved gate electrode therebetween in a semiconductor substrate, wherein the shape of a groove corner in said gate electrode is contained among two concentric circles having each of radius of curvature $r+L/5$ and $r-L/5$, where L ($\mu$m) indicates a channel length, and a geometric parameter represented by the radius of curvature r ($\mu$m) has a relationship with a doping concentration N (cm$^{-3}$) in said semiconductor substrate as expressed by $(\frac{2}{3}) \cdot (\log_{10} r + 28) - \frac{2}{3} < \log_{10} N < (\frac{2}{3}) \cdot (\log_{10} r + 28) + \frac{1}{2}$.

4. A memory cell comprising a combination of a storage capacitor and a grooved gate transistor having source and drain diffused layers with a grooved gate electrode therebetween in a semiconductor substrate, wherein a geometric parameter represented by an average A $(=(a+b)/2)$ ($\mu$m) of a sum of two sides a and b forming the right angle of a right triangle formed of a straight line in contact with the bottom of the gate in parallel to the surface of the semiconductor substrate, a perpendicular line to the substrate bottom surface from the source and drain ends at a portion formed with a channel and a straight line in contact with a groove corner of the gate electrode has a relationship with a doping concentration N (cm$^{-3}$) in said semiconductor substrate as expressed by $(\zeta) \cdot (\log_{10} A + 28) - \frac{1}{2} < \log_{10} N < (\frac{2}{3}) \cdot (\log_{10} A + 28) + \frac{1}{2}$.

* * * * *

UNITED STATES PATENT AND TRADEMARK OFFICE
CERTIFICATE OF CORRECTION

PATENT NO. : 5,408,116
DATED : April 18, 1995
INVENTOR(S) : Junko Tanaka, et al.

It is certified that error appears in the above-indentified patent and that said Letters Patent is hereby corrected as shown below:

Claim 4, column 8, line 39, delete "($)" and substitute therefor --(2/3)--.

Signed and Sealed this

Twentieth Day of June, 1995

*Attest:*

BRUCE LEHMAN

*Attesting Officer*  *Commissioner of Patents and Trademarks*